US012710477B2

(12) United States Patent
Jang et al.

(10) Patent No.: US 12,710,477 B2
(45) Date of Patent: Aug. 18, 2026

(54) APPARATUS AND METHOD FOR MONITORING VEHICLE BATTERY

(71) Applicants: HYUNDAI MOTOR COMPANY, Seoul (KR); Kia Corporation, Seoul (KR)

(72) Inventors: Yoo Hong Jang, Suwon-si (KR); Yoon Sung Choi, Hwaseong-si (KR); Sang Jin Lee, Goyang-si (KR); Hyo Kyung Lee, Anyang-si (KR); Yo Han Baek, Anyang-si (KR)

(73) Assignees: HYUNDAI MOTOR COMPANY, Seoul (KR); Kia Corporation, Seoul (KR)

( * ) Notice: Subject to any disclaimer, the term of this patent is extended or adjusted under 35 U.S.C. 154(b) by 388 days.

(21) Appl. No.: 18/388,920

(22) Filed: Nov. 13, 2023

(65) Prior Publication Data

US 2025/0028000 A1 Jan. 23, 2025

(30) Foreign Application Priority Data

Jul. 17, 2023 (KR) ........................ 10-2023-0092616

(51) Int. Cl.
*G01R 31/3835* (2019.01)
*G01R 31/371* (2019.01)
(Continued)

(52) U.S. Cl.
CPC ....... *G01R 31/3835* (2019.01); *G01R 31/371* (2019.01); *G01R 31/396* (2019.01);
(Continued)

(58) Field of Classification Search
CPC .............. G01R 31/3835; G01R 31/371; G01R 31/396; G01R 31/52; G01R 31/392;
(Continued)

(56) References Cited

U.S. PATENT DOCUMENTS

2019/0305384 A1* 10/2019 Liu ...................... G01R 31/367
2022/0144132 A1* 5/2022 Jin ....................... G01R 31/389
(Continued)

FOREIGN PATENT DOCUMENTS

JP 105-121102 A 5/1993
JP H08-98324 A 4/1996
(Continued)

*Primary Examiner* — Garcia Ade
(74) *Attorney, Agent, or Firm* — MORGAN, LEWIS & BOCKIUS LLP

(57) ABSTRACT

An apparatus for monitoring a battery of a vehicle includes one or more sensors and a processor, wherein the one or more sensors may obtain a first voltage during a stabilization time of the battery, obtain a minimum voltage measured from a time point when the stabilization time ends to a time point when parking of the vehicle ends as a second voltage of the battery, and detect a temperature of the battery from a time point when the first voltage is obtained to a time point when the second voltage is obtained, and the processor may determine a first discharge amount based on the first voltage and the second voltage, determine a second discharge amount consumed in balancing the battery and operating the one or more sensors, determine a first self-discharge amount and a second self-discharge amount based on the first discharge amount, the second discharge amount, and the temperature, and determine whether a short circuit has occurred in the battery based on the first self-discharge amount and the second self-discharge amount.

20 Claims, 9 Drawing Sheets

(51) Int. Cl.

| | |
|---|---|
| ***G01R 31/396*** | (2019.01) |
| ***G01R 31/52*** | (2020.01) |
| ***H01M 10/48*** | (2006.01) |
| *B60L 58/16* | (2019.01) |

(52) U.S. Cl.

CPC .......... *G01R 31/52* (2020.01); *H01M 10/486* (2013.01); *H01M 2220/20* (2013.01)

(58) Field of Classification Search

CPC .. G01R 19/30; G01R 31/3646; G01R 31/367; G01R 31/382; G01R 31/385; H01M 10/486; H01M 2220/20; Y02E 60/10; B60L 58/12; B60L 58/16

See application file for complete search history.

(56) References Cited

U.S. PATENT DOCUMENTS

| | | | | |
|---|---|---|---|---|
| 2022/0281349 | A1 | 9/2022 | Kim | |
| 2023/0009288 | A1* | 1/2023 | Kang | B60L 58/16 |
| 2024/0133972 | A1* | 4/2024 | Sung | B60L 58/10 |

FOREIGN PATENT DOCUMENTS

| | | | |
|---|---|---|---|
| KR | 10-0901559 | B1 | 6/2009 |
| KR | 10-2018-0007123 | A | 1/2018 |
| KR | 10-2021-0145024 | A | 12/2021 |

* cited by examiner no short

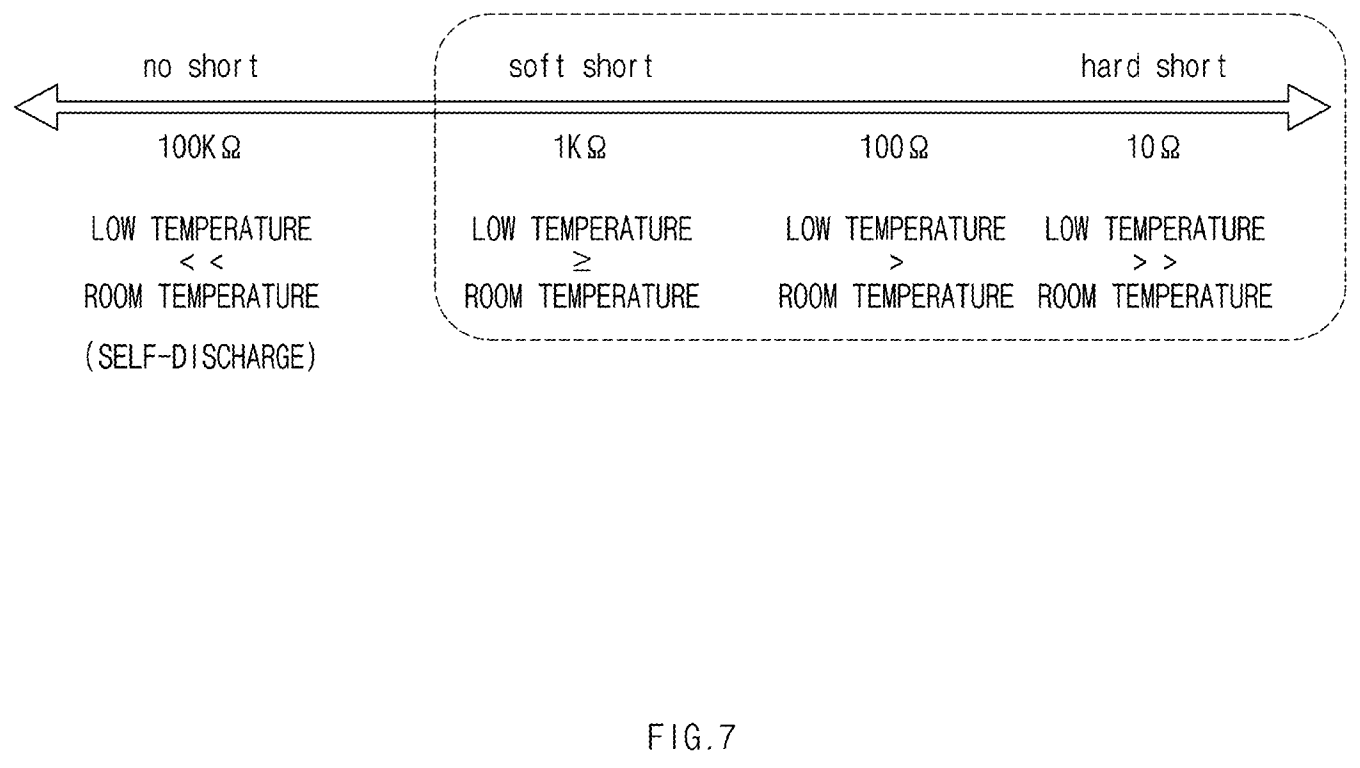

100KΩ

LOW TEMPERATURE << ROOM TEMPERATURE (SELF-DISCHARGE)

soft short

1KΩ

LOW TEMPERATURE ≥ ROOM TEMPERATURE

100Ω

LOW TEMPERATURE > ROOM TEMPERATURE hard short

10Ω

LOW TEMPERATURE >> ROOM TEMPERATURE

FIG. 7

APPARATUS AND METHOD FOR MONITORING VEHICLE BATTERY

CROSS-REFERENCE TO RELATED APPLICATION

The present application claims priority to Korean Patent Application No. 10-2023-0092616, filed on Jul. 17, 2023, the entire contents of which is incorporated herein for all purposes by this reference.

BACKGROUND OF THE PRESENT DISCLOSURE

Field of the Present Disclosure

The present disclosure relates to an apparatus and method for monitoring a vehicle battery.

Description of Related art

Recently, technologies for securing battery stability are being developed as devices provided with batteries, such as energy storage systems (ESSs) and electric vehicles, are widely used.

Therefore, a battery pack is formed by detecting defects before using a battery, but when the battery deteriorates or an impact is applied, a short circuit occurs. As the short circuit grows, the area of the short circuit increases, the short circuit resistance decreases, and a current flowing through the short circuit increases. When the current flowing through the short circuit increases, the amount of heat generated increases, and accordingly, the temperature rises at a portion where the short circuit occurs. When the temperature of the portion where the short circuit occurs exceeds a critical temperature, it may ignite and cause a fire, and there is also a possibility of an explosion. Because a plurality of batteries is connected, once a fire occurs, it is difficult to actually extinguish the fire. Therefore, it is required to monitor and manage occurrence of the short circuit of the battery to prevent a fire from occurring.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an apparatus and method for monitoring a battery, configured for preventing fire occurrence by monitoring the occurrence of a short circuit, which is the main cause of battery fire, to secure the stability of the use of devices using batteries.

Various aspects of the present disclosure are directed to providing an apparatus and method for monitoring a battery, configured for monitoring the amount of self-discharge of a battery according to temperature, determining whether a short circuit has occurred based on the amount of self-discharge according to temperature, and informing a user of occurrence of the short circuit when it is determined that the short circuit has occurred.

Various aspects of the present disclosure are directed to providing an apparatus and method for monitoring a battery, configured for ensuring that sufficient time is secured between a time point at which the minimum voltage of the battery cell is measured during the stabilization time after the driving of the vehicle is finished or the charging of the vehicle is finished, and a time point at which the minimum voltage of the battery cell is measured before driving of the vehicle is resumed, thus minimizing sensing error and accurately determining the amount of self-discharge.

Various aspects of the present disclosure are directed to providing an apparatus and method for monitoring a battery, configured for determining whether a short circuit has occurred in a battery in various environments by monitoring the self-discharge of the battery to determine whether a short circuit has occurred in the battery and performing the monitoring in self-discharge at room temperature and self-discharge at low temperature.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, an apparatus for monitoring a battery of a vehicle includes one or more sensors and a processor, wherein the one or more sensors obtain a first voltage during a stabilization time of the battery, obtain a minimum voltage measured from a time point when the stabilization time ends to a time point when parking of the vehicle ends as a second voltage of the battery, and detect a temperature of the battery from a time point when the first voltage is obtained to a time point when the second voltage is obtained, and the processor is further configured to determine a first discharge amount based on the first voltage and the second voltage, is configured to determine a second discharge amount consumed in balancing the battery and operating the one or more sensors, is configured to determine a first self-discharge amount and a second self-discharge amount based on the first discharge amount, the second discharge amount, and the temperature, and is configured to determine whether a short circuit has occurred in the battery based on the first self-discharge amount and the second self-discharge amount.

According to an exemplary embodiment of the present disclosure, the sensor may obtain, as the first voltage, a maximum voltage among voltages obtained during the stabilization time of the battery after the driving of the vehicle is finished.

According to an exemplary embodiment of the present disclosure, the sensor may obtain, as the first voltage, a minimum voltage among voltages obtained during the stabilization time of the battery after the charging of the vehicle is finished.

According to an exemplary embodiment of the present disclosure, the processor is further configured to determine the first discharge amount based on the first voltage and the second voltage when a time required from the time point when the first voltage is obtained to the time point when the second voltage is obtained exceeds a threshold time.

According to an exemplary embodiment of the present disclosure, the processor is further configured to determine an amount of change in a state of charge (SOC) value of the battery with respect to a difference between the first voltage and the second voltage based on a pre-stored lookup table and determine the first discharge amount.

According to an exemplary embodiment of the present disclosure, the processor is further configured to determine a difference between the first discharge amount and the second discharge amount as a self-discharge amount.

According to an exemplary embodiment of the present disclosure, the processor may set, as the first self-discharge amount, the self-discharge amount when a minimum temperature of temperatures of the battery from the time point when the first voltage is obtained to the time point when the second voltage is obtained is equal to or greater than a first predetermined temperature.

According to an exemplary embodiment of the present disclosure, the processor may set, as the second self-discharge amount, the self-discharge amount when a maximum temperature of temperatures of the battery from the time point when the first voltage is obtained to the time point when the second voltage is obtained is equal to or lower than a second predetermined temperature lower than the first predetermined temperature.

According to an exemplary embodiment of the present disclosure, the processor is further configured to output a message informing that a preliminary diagnosis of the battery is required when a case where a ratio of the second self-discharge amount to the first self-discharge amount is greater than a short circuit non-occurrence threshold and is less than a short circuit occurrence threshold has occurred continuously and repeatedly a predetermined number of times.

According to an exemplary embodiment of the present disclosure, the processor is further configured to output a message informing that an emergency diagnosis of the battery is required when the ratio of the second self-discharge amount to the first self-discharge amount is greater than the short-circuit occurrence threshold.

According to an aspect of the present disclosure, a method of monitoring a battery of a vehicle includes obtaining a first voltage during a stabilization time of the battery, obtaining, a minimum voltage measured from a time point when the stabilization time ends to a time point when parking of the vehicle ends as a second voltage of the battery, detecting a temperature of the battery from a time point when the first voltage is obtained to a time point when the second voltage is obtained, determining a first discharge amount based on the first voltage and the second voltage, determining a second discharge amount consumed in balancing the battery and operating the one or more sensors, determining a first self-discharge amount and a second self-discharge amount based on the first discharge amount, the second discharge amount, and the temperature, and determining whether a short circuit has occurred in the battery based on the first self-discharge amount and the second self-discharge amount.

According to an exemplary embodiment of the present disclosure, the method may further include obtaining, as the first voltage, a maximum voltage among voltages obtained during the stabilization time of the battery after the driving of the vehicle is finished.

According to an exemplary embodiment of the present disclosure, the method may further include obtaining, as the first voltage, a minimum voltage among voltages obtained during the stabilization time of the battery after the driving of the vehicle is finished.

According to an exemplary embodiment of the present disclosure, the method may further include determining the first discharge amount based on the first voltage and the second voltage when a time required from the time point when the first voltage is obtained to the time point when the second voltage is obtained exceeds a threshold time.

According to an exemplary embodiment of the present disclosure, the method may further include determining an amount of change in a state of charge (SOC) value of the battery with respect to a difference between the first voltage and the second voltage based on a pre-stored lookup table and determine the first discharge amount.

According to an exemplary embodiment of the present disclosure, the method may further include determining a difference between the first discharge amount and the second discharge amount as a self-discharge amount.

According to an exemplary embodiment of the present disclosure, the method may further include setting, as the first self-discharge amount, the self-discharge amount when a minimum temperature of temperatures of the battery from the time point when the first voltage is obtained to the time point when the second voltage is obtained is equal to or greater than a first predetermined temperature.

According to an exemplary embodiment of the present disclosure, the method may further include setting, as the second self-discharge amount, the self-discharge amount when a maximum temperature of temperatures of the battery from the time point when the first voltage is obtained to the time point when the second voltage is obtained is equal to or lower than a second predetermined temperature lower than the first predetermined temperature.

According to an exemplary embodiment of the present disclosure, the method may further include outputting a message informing that a preliminary diagnosis of the battery is required when a case where a ratio of the second self-discharge amount to the first self-discharge amount is greater than a short circuit non-occurrence threshold and is less than a short circuit occurrence threshold has occurred continuously and repeatedly a predetermined number of times.

According to an exemplary embodiment of the present disclosure, the method may further include outputting a message informing that an emergency diagnosis of the battery is required when the ratio of the second self-discharge amount to the first self-discharge amount is greater than the short-circuit occurrence threshold.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 7 is a diagram showing whether a short circuit has occurred and a short circuit strength according to short circuit resistance according to an exemplary embodiment of the present disclosure;

Figure 1:
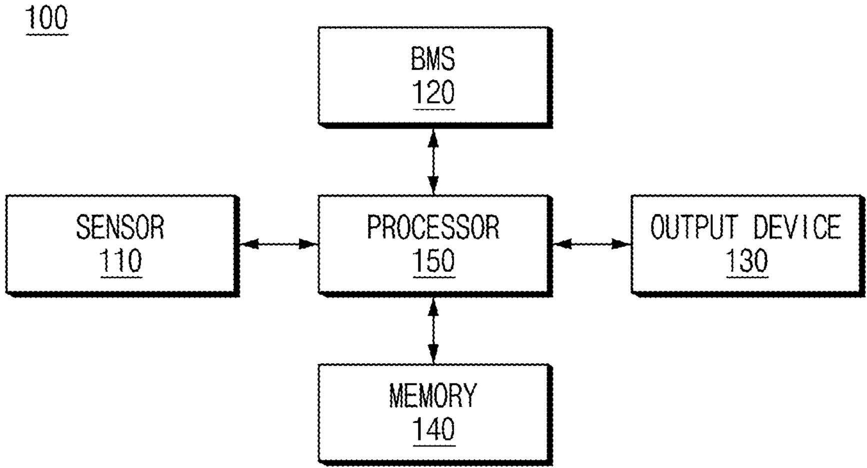
FIG. 1 is a diagram illustrating a configuration of an apparatus for monitoring a battery of a vehicle according to an exemplary embodiment of the present disclosure.

It may be understood that the appended drawings are not necessarily to scale, presenting a somewhat simplified representation of various features illustrative of the basic principles of the present disclosure. The predetermined design features of the present disclosure as included herein, including, for example, specific dimensions, orientations, locations, and shapes will be determined in part by the particularly intended application and use environment.

In the figures, reference numbers refer to the same or equivalent portions of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments of the present disclosure will be described in detail with reference to the exemplary drawings. In adding the reference numerals to the components of each drawing, it should be noted that the identical or equivalent component is designated by the identical numeral even when they are displayed on other drawings. Furthermore, in describing the exemplary embodiment of the present disclosure, a detailed description of well-known features or functions will be ruled out in order not to unnecessarily obscure the gist of the present disclosure.

In describing the components of the exemplary embodiment of the present disclosure, terms such as first, second, "A", "B", (a), (b), and the like may be used. These terms are merely intended to distinguish one component from another component, and the terms do not limit the nature, sequence or order of the constituent components. Unless otherwise defined, all terms used herein, including technical or scientific terms, include the same meanings as those generally understood by those skilled in the art to which the present disclosure pertains. Such terms as those defined in a generally used dictionary are to be interpreted as including meanings equal to the contextual meanings in the relevant field of art, and are not to be interpreted as including ideal or excessively formal meanings unless clearly defined as including such in the present application.

FIG. 1 is a diagram illustrating a configuration of an apparatus for monitoring a battery for a vehicle according to an exemplary embodiment of the present disclosure.

Referring to FIG. 1, an apparatus 100 for monitoring a battery for a vehicle may include a sensor 110, a battery management system (BMS) 120, an output device 130, a memory 140, and a processor 150.

The sensor 110 may include a voltage sensor that obtains a first voltage during the stabilization time of the battery and obtains a second voltage of the battery before driving of the vehicle after the stabilization time of the battery has expired. Furthermore, the sensor 110 may include a current sensor that obtains a current of the battery. Furthermore, the sensor 110 may include a temperature sensor configured for sensing temperatures at which the first voltage and the second voltage are obtained, and may include a speed sensor configured for sensing various conditions of the vehicle, a battery sensor, and the like.

The battery management system (BMS) 120 may perform control to, or not to, transfer power from the battery to a vehicle load through a relay based on a battery state (charged state and discharged state). A more detailed description will be provided with reference to FIG. 2.

Figure 2:
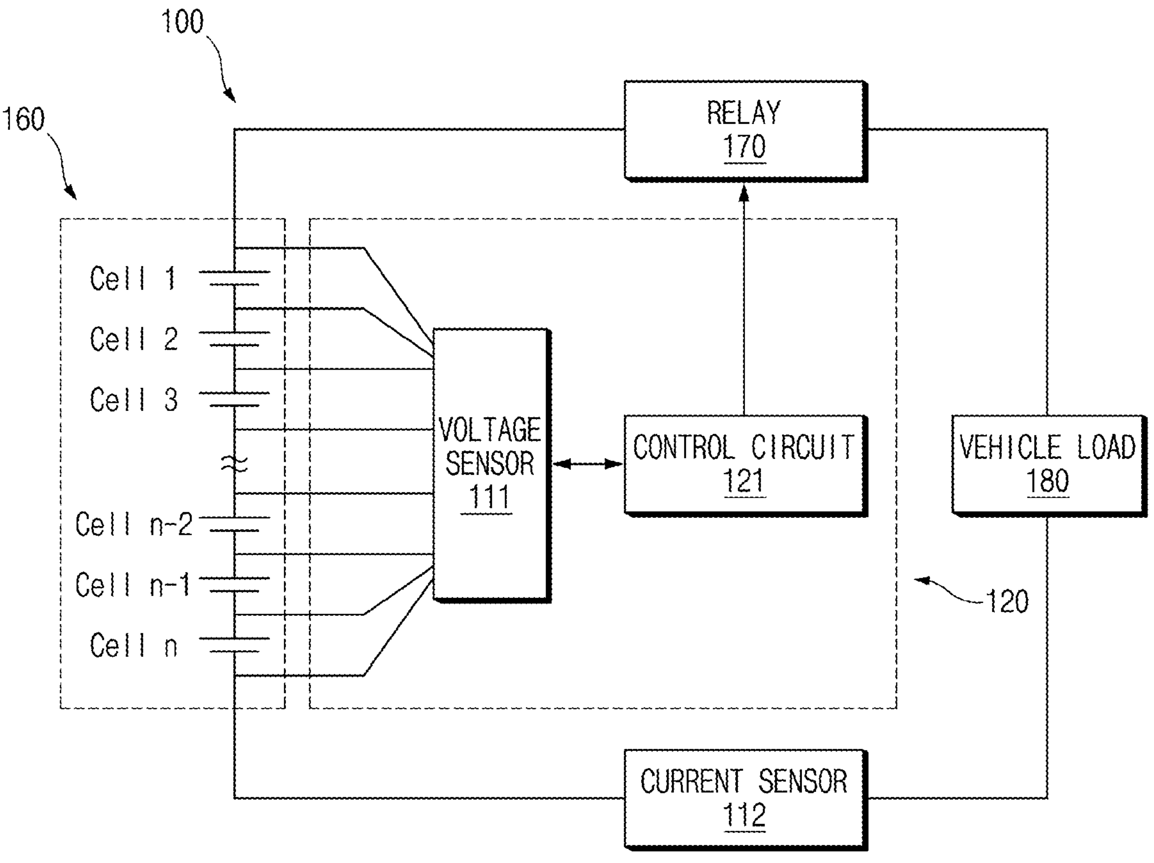
FIG. 2 is a diagram schematically illustrating a battery management system (BMS) connected to a battery according to an exemplary embodiment of the present disclosure.

FIG. 2 is a diagram schematically illustrating a battery management system (BMS) connected to a battery according to an exemplary embodiment of the present disclosure.

As shown in FIG. 2, the BMS 120 may include a control circuit 121 that is configured to perform overall control operations. The control circuit 121 may perform voltage balancing of a plurality (n) of battery cells included in the battery (a battery module 160) to adjust the voltage of the battery cells, and when a specific battery cell fails, perform control to cope with the failure using other battery cells through cell balancing. Also, the control circuit 121 may be configured for controlling charging and discharging of the battery cells based on a current obtained by the current sensor.

The control circuit 121 may be configured to predict a state of charge (SOC) value of the battery based on the voltage and current of the battery cells obtained by a voltage sensor 111 and a current sensor 112, a temperature of the battery and the like. The control circuit 121 may be configured for controlling a relay 170 based on the SOC value of the battery to, or not to, apply power to a vehicle load 180. Here, the vehicle load 180 may include an electronic device mounted on the vehicle and capable of operating by receiving power from the battery.

The output device 130 may output images or sounds under the control of the processor 150. According to an exemplary embodiment of the present disclosure, the output device 130 may be implemented with a display device, a sound output device, or the like. Here, the display device may include a HUD, a cluster, and the like. According to an exemplary embodiment of the present disclosure, the display device may be implemented using a display device employing a liquid crystal display (LCD) panel, a light emitting diode (LED) panel, an organic light emitting diode (OLED) panel, or a plasma display panel (PDP). The liquid crystal display may include a thin film transistor liquid crystal display (TFT-LCD). The display device may be integrally implemented by a touch screen panel (TSP).

The memory 140 may store at least one or more algorithms for performing operations or execution of various commands for the operation of the apparatus for monitoring the battery of the vehicle according to an exemplary embodiment of the present disclosure. According to an exemplary embodiment of the present disclosure, the memory 140 may store at least one instruction to be executed by the processor 150, and the instruction may cause the apparatus for monitoring the battery of the vehicle of the present disclosure to operate. The memory 140 may include at least one medium of a flash memory, a hard disk, a memory card, a Read-Only Memory (ROM), a Random Access Memory (RAM), an Electrically Erasable Programmable Read-Only Memory (EEPROM) Memory, a Programmable Read-Only Memory (PROM), a magnetic memory, a magnetic disk, and an optical disk.

The processor 150 may be implemented by various processing devices incorporating a semiconductor chip configured for operating or executing various instructions or the like and may be configured for controlling an operation of the apparatus for monitoring the battery of the vehicle according to an exemplary embodiment of the present disclosure. The processor 150 may be electrically connected to the sensor 110, the BMS 120, the output device 130, and the memory 140 through wire cables or various circuits to transfer electrical signals including control commands and perform determinations or data processing related to control and/or communication. The processor 150 may include at least one of a central processing unit, an application processor, a communication processor (CP), or any combination thereof.

According to an exemplary embodiment of the present disclosure, when the processor 150 obtains a voltage of each of battery cells, the processor 150 may obtain, as a first voltage, the maximum voltage among the voltages of the battery cells obtained during the stabilization time (e.g., 2 hours) of the battery after the driving of the vehicle is finished. Furthermore, the processor 150 may obtain, as a second voltage, the minimum voltage among the voltages obtained in the battery cells from the end of the stabilization time to the end of parking of the vehicle (the time point when driving of the vehicle starts). A more detailed description will be provided with reference to FIG. 3.

Figure 3:
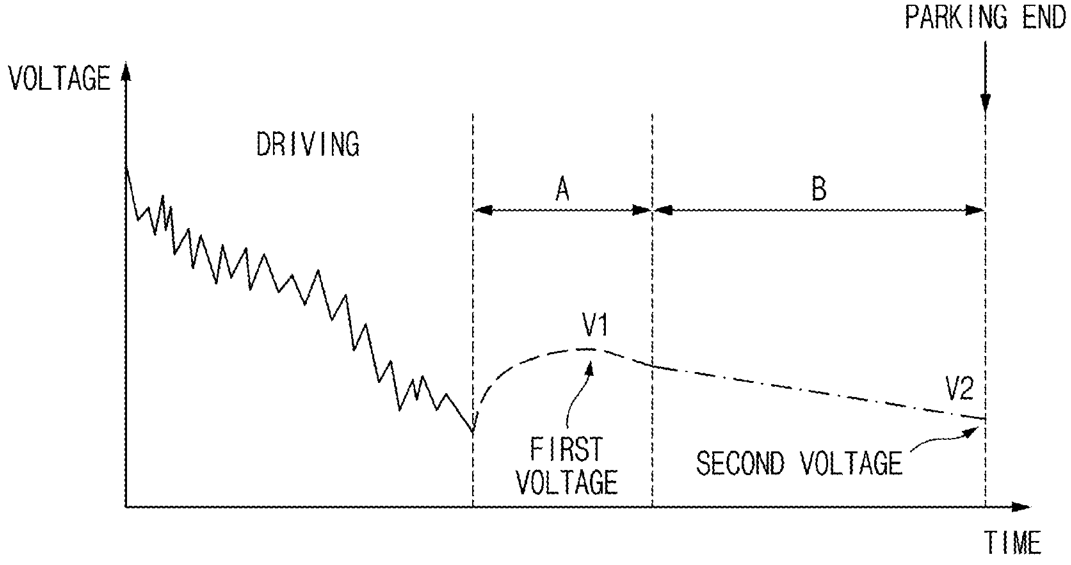
FIG. 3 is a graph showing an amount of change in voltage due to stabilization time and self-discharge after driving of a vehicle is finished according to an exemplary embodiment of the present disclosure.

FIG. 3 is a graph showing an amount of change in voltage due to stabilization time and self-discharge after driving of a vehicle is finished according to an exemplary embodiment of the present disclosure.

As shown in FIG. 3, the processor 150 may obtain, as a first voltage, a maximum voltage V1 among the voltages of battery cells obtained during a stabilization time "A" after the driving of the vehicle is finished. Furthermore, the processor 150 may be configured to determine a self-discharge time "B" from the time point at which the stabilization time ends to the time point at which parking of the vehicle ends (the time point at which vehicle driving starts), and obtain, as a second voltage, a minimum voltage V2 among the voltages obtained in the battery cells during the self-discharge time "B".

According to another exemplary embodiment of the present disclosure, when the processor 150 obtains a voltage of each of battery cells, the processor 150 may obtain, as a first voltage, the minimum voltage among the voltages of the battery cells obtained during the stabilization time (e.g., 2 hours) of the battery after the charging of the vehicle is finished. Furthermore, the processor 150 may obtain, as a second voltage, the minimum voltage among the voltages obtained in the battery cells from the time point when the stabilization time ends to the time point when the parking of the vehicle ends (the time point when the driving of the vehicle starts). A more detailed description will be provided with reference to FIG. 4.

Figure 4:
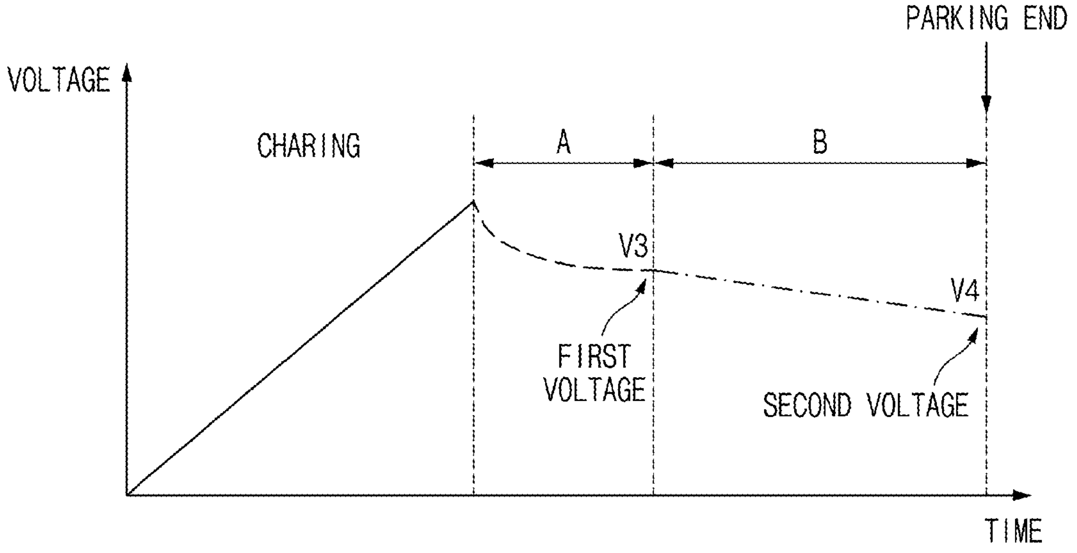
FIG. 4 is a graph showing an amount of change in voltage due to stabilization time and self-discharge after charging of a vehicle is finished according to an exemplary embodiment of the present disclosure.

FIG. 4 is a graph showing an amount of change in voltage due to stabilization time and self-discharge after charging of a vehicle is finished according to an exemplary embodiment of the present disclosure.

As shown in FIG. 4, the processor 150 may obtain, as a first voltage, a minimum voltage V3 among the voltages of battery cells obtained during the stabilization time "A" after the charging of the vehicle is finished. Furthermore, the processor 150 may be configured to determine a self-discharge time "B" from the time point at which the stabilization time ends to the time point at which parking of the vehicle ends, and obtain, as a second voltage, a minimum voltage V4 among the voltages obtained in the battery cells during the self-discharge time "B".

According to an exemplary embodiment of the present disclosure, the processor 150 may be configured to determine the slope of the linear function of the moving average line of cell voltages of each battery, predict a voltage at the time point when parking of the vehicle is finished using the slope of the linear function, and set the predicted voltage as the second voltage. A more detailed description will be provided with reference to FIG. 5.

Figure 5:
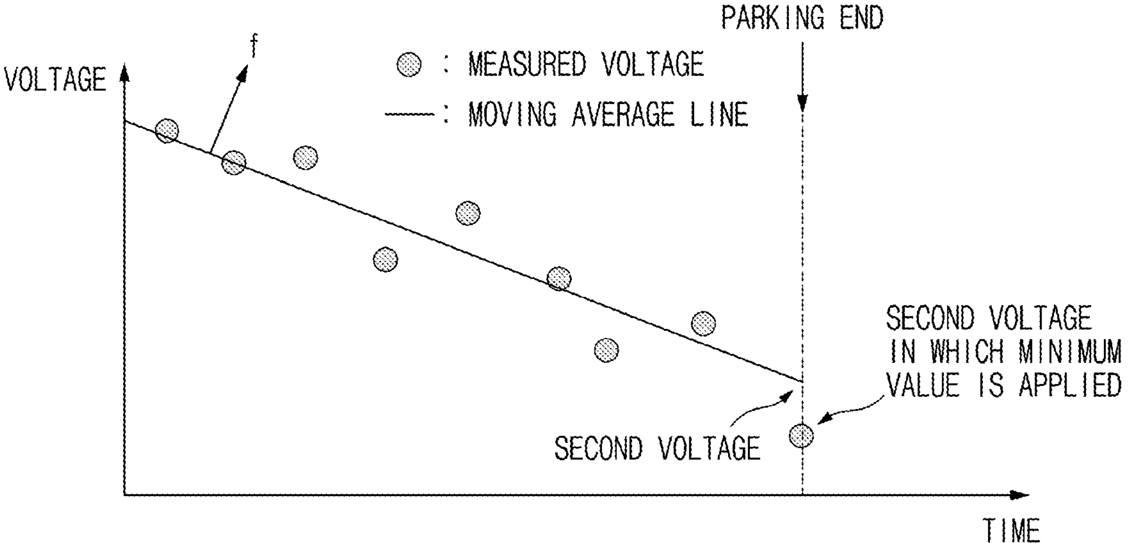
FIG. 5 is a graph schematically illustrating a method of determining a second voltage according to an exemplary embodiment of the present disclosure.

FIG. 5 is a graph schematically illustrating a method of determining a second voltage according to an exemplary embodiment of the present disclosure.

Referring to FIG. 5, the processor 150 may be configured to generate a moving average line "f" representing an average of voltages of the battery cells obtained by the voltage sensor, and determine a slope of the linear function of the moving average line "f". Furthermore, the processor 150 may set the voltage at the time point when parking of the vehicle ends as the second voltage by use of the slope of the linear function of the moving average line "f". The above method may minimize an error of the voltage sensor in setting the second voltage, and may be applied when an error occurs in the voltage sensor.

The processor 150 may obtain temperatures of the battery cells from the time point at which the first voltage is obtained to the time point at which the second voltage is obtained.

The processor 150 may be configured to determine whether a time required from the time point at which the first voltage is obtained to the time point at which the second voltage is obtained exceeds a threshold time (e.g., 6 hours).

The processor 150 may be configured to determine the amount of self-discharge when it is determined that the time from the time point at which the first voltage is obtained to the time point at which the second voltage is obtained exceeds the threshold time (e.g., 6 hours). According to an exemplary embodiment of the present disclosure, the amount of self-discharge may be determined as a difference between a first discharge amount and a second discharge amount.

According to an exemplary embodiment of the present disclosure, the processor 150 may be configured to determine the first discharge amount based on the first voltage and the second voltage. When the time required from the time point at which the first voltage is obtained to the time point at which the second voltage is obtained does not exceed the threshold time, an error in the voltage sensor may cause an error in the SOC value of the battery, reducing the accuracy of battery information. Therefore, the processor 150 may be configured to determine the first discharge amount based on the first voltage and the second voltage only when the time required from the time point at which the first voltage is obtained to the time point at which the second voltage is obtained exceeds the threshold time, thus making it possible to accurately determine the amount of self-discharge.

According to an exemplary embodiment of the present disclosure, the processor 150 may be configured to determine the amount of change in the state of charge of the battery with respect to the difference between the first voltage and the second voltage, and determine the first discharge amount based on a pre-stored lookup table. According to an exemplary embodiment of the present disclosure, the processor 150 may be configured to generate a lookup table representing battery capacity according to SOC based on an open circuit voltage (OCV)-state of charge (SOC) profile and store the lookup table in the memory 140 in advance. According to an exemplary embodiment of the present disclosure, the processor 150 may store the battery capacity by performing classification into a case where the state of health (SOH) is 100% and a case where the state of health (SOH) is 90%, and the battery capacity may be determined by Equation 1.

$$\text{Battery Capacity} = SOC(\%) * BOL(\text{Ah}) * SOH(\%) \quad \text{[Equation 1]}$$

(Here, BOL is Beginning Of Life, and may represent the battery capacity in a state where the battery is not degraded)

For example, when the OCV is 3.9, the SOC is 90%, the BOL is 70 Ah, and the SOH is 100%, the processor 150 may be configured to determine the battery capacity according to 0.9*70*1, which is determined as 63 Ah. The lookup table representing the battery capacity determined in the above-described manner may be represented as shown in Table 1, and the processor 150 may store the lookup table in the memory 140 in advance.

TABLE 1

| OCV | SOC | Battery Capacity (SOH(100%)) | Battery Capacity (SOH(90%)) |
|---|---|---|---|
| 2.7 | 0% | 0 Ah | 0 Ah |
| 3.0 | 8% | 5.6 Ah | 5.04 Ah |
| 3.3 | 17% | 11.91 Ah | 10.71 Ah |
| 3.6 | 60% | 42 Ah | 37.8 Ah |
| 3.9 | 90% | 63 Ah | 56.7 Ah |
| 4.2 | 100% | 70 Ah | 63 Ah |

According to an exemplary embodiment of the present disclosure, the processor 150 may be configured to determine the amount of change in the state of charge of the battery with respect to the difference between the first voltage and the second voltage based on the pre-stored lookup table and determine the first discharge amount. According to an exemplary embodiment of the present disclosure, the processor 150 may match, with the OCV, the first voltage and the second voltage when the time required from the time point at which the first voltage is obtained to the time point at which the second voltage is obtained exceeds the threshold time. Furthermore, the processor 150 may be configured to determine the amount of change in SOC relative to the amount of change in OCV according to a difference between the first voltage and the second voltage, and determine a corresponding difference in battery capacity as the first discharge amount.

The processor 150 may be configured to determine a capacity consumed for cell balancing and voltage measurement of the battery, and may set the capacity consumed for battery cell balancing and voltage measurement as the second discharge amount.

The processor 150 may be configured to determine the difference between the first discharge amount and the second discharge amount as the amount of self-discharge.

The processor 150 may set the amount of self-discharge to a first self-discharge amount when the minimum temperature among the temperatures of the battery cells from the time point at which the first voltage is obtained to the time point at which the second voltage is obtained is higher than or equal to a first predetermined temperature. Here, the first predetermined temperature may be set to 20 degrees (° C.), and the first self-discharge amount may mean a room temperature discharge amount.

The processor 150 may set the amount of self-discharge to a second self-discharge amount when the maximum temperature among the temperatures of the battery cells from the time point at which the first voltage is obtained to the time point at which the second voltage is obtained is equal to or less than a second predetermined temperature lower than the first predetermined temperature. Here, the second predetermined temperature may be set to 5 degrees (° C.), and the second self-discharge amount may mean a low-temperature discharge amount.

The processor 150 may be configured to determine whether a short circuit of the battery has occurred based on the first self-discharge amount and the second self-discharge amount.

When the second self-discharge amount is greater than the first self-discharge amount, the processor 150 may be configured to determine whether a short circuit has occurred in the battery and a short circuit strength based on a short circuit resistance value. A more detailed description related thereto will be provided with reference to FIGS. 6 to 7.

Figure 6:
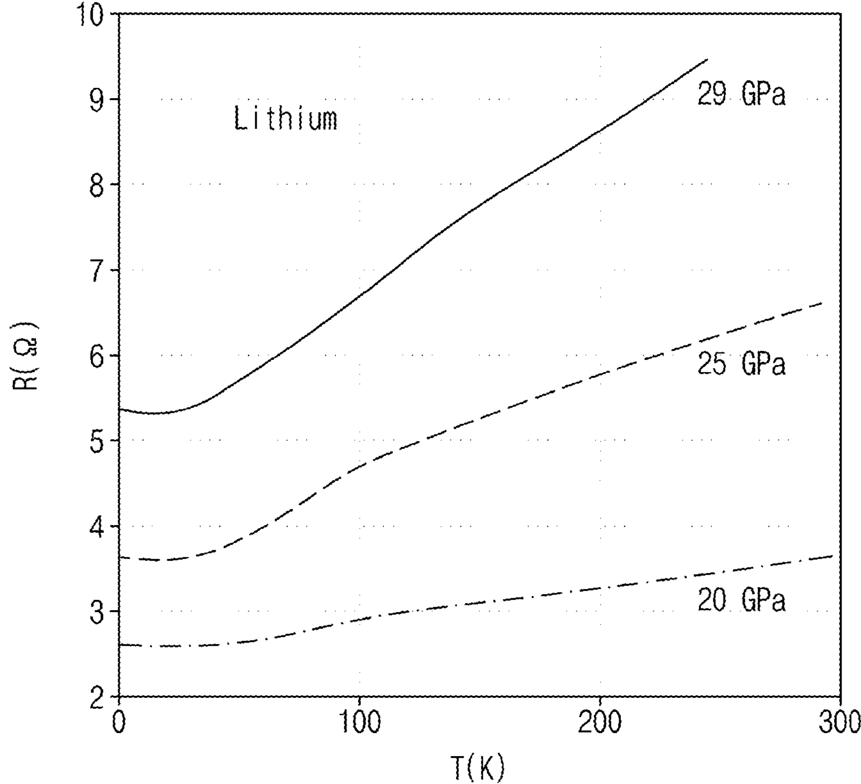
FIG. 6 is a graph showing short circuit resistance according to temperature.

FIG. 6 is a graph showing short circuit resistances according to temperatures, and FIG. 7 is a diagram showing whether a short circuit has occurred and short circuit strengths according to short circuit resistances.

Referring to FIG. 6, the short circuit resistance may have a characteristic of decreasing as the temperature decreases. Therefore, the processor 150 may be configured to determine that no short circuit has occurred because the short circuit resistance includes the largest first resistance value (e.g., 100 kΩ) when the first self-discharge amount which is available through determination when the temperature is equal to or greater than the first predetermined temperature is greater than the second self-discharge amount.

Furthermore, when the second self-discharge amount is greater than or equal to the first self-discharge amount, the processor 150 may be configured to determine that a soft short circuit has occurred because the short circuit resistance has a second resistance value (e.g., 1 kΩ) smaller than the first resistance value.

Furthermore, because the short circuit resistance has a third resistance value (100 ohms) smaller than the second resistance value and then a fourth resistance value (10 ohms) as the excess of the second self-discharge amount over the first self-discharge amount increases, the processor 150 may be configured to determine that a hard short circuit has occurred.

According to another exemplary embodiment of the present disclosure, the processor 150 may be configured to determine a ratio of the second self-discharge amount to the first self-discharge amount, and determine whether a short circuit has occurred by comparing the determined ratio with a short circuit occurrence threshold and a short circuit non-occurrence threshold. According to an exemplary embodiment of the present disclosure, the processor 150 may be configured to determine the ratio of the second self-discharge amount to the first self-discharge amount in a classification manner according to an average temperature at which a voltage is obtained.

According to an exemplary embodiment of the present disclosure, the processor 150 may be configured to determine a first average temperature, which is an average of the temperatures at which the first voltage and the second voltage are obtained, when the minimum temperature at which the first voltage and the second voltage are obtained is equal to or greater than a first predetermined temperature, and determine a second average temperature, which is an average of the temperatures at which the first voltage and the second voltage are obtained, when the maximum temperature at which the first voltage and the second voltage are obtained is equal to or lower than a second predetermined temperature. Accordingly, the processor 150 may be configured to determine the ratio of the second self-discharge amount to the first self-discharge amount according to a difference between the first average temperature and the second average temperature.

To the present end, the processor 150 may set a short circuit occurrence threshold and a short circuit non-occurrence threshold for determining whether a short circuit has occurred in a battery.

The processor 150 may be configured to determine a first test self-discharge amount and a second test self-discharge amount to set the short circuit occurrence threshold and the short circuit non-occurrence threshold.

First, the processor 150 may obtain a first test voltage and a second test voltage to determine the first test self-discharge amount and the second test self-discharge amount. Here, the processor 150 may obtain the first test voltage in the same manner as obtaining the first voltage, and obtain the second test voltage in the same manner as obtaining the second voltage.

The processor 150 may be configured to determine a first test temperature, which is an average of the temperatures at which the first test voltage and the second test voltage are obtained, when the minimum temperature at which the first test voltage and the second test voltage are obtained is equal to or greater than the first predetermined temperature, and determine a second test temperature, which is an average of the temperatures at which the first test voltage and the second test voltage are obtained, when the maximum temperature at which the first test voltage and the second test voltage are obtained is equal to or lower than the second predetermined temperature.

The processor 150 may set the short circuit occurrence threshold and the short circuit non-occurrence threshold while the ratios of the second test self-discharge amount to the first test self-discharge amount are classified into a case where a short circuit occurs and a case where a short circuit does not occur in the battery, and the short circuit occurrence threshold and the short circuit non-occurrence threshold may be stored separately by differences between the first test temperature and the second test temperature. A more detailed description will be provided with reference to Table 2.

TABLE 2

| Second test self-discharge amount/First test self-discharge amount *100 (%) | | |
|---|---|---|
| Temperature difference | Short circuit non-occurrence threshold | Short circuit occurrence threshold |
| 15 | 90% | 104% |
| 20 | 85% | 105% |
| 25 | 80% | 106% |

TABLE 2-continued

| Second test self-discharge amount/First test self-discharge amount *100 (%) | | |
|---|---|---|
| Temperature difference | Short circuit non-occurrence threshold | Short circuit occurrence threshold |
| 30 | 75% | 107% |
| 35 | 70% | 108% |

According to an exemplary embodiment of the present disclosure, the processor 150 may match a difference between the first average temperature and the second average temperature with a difference between the first test temperature and the second test temperature, and compare the short circuit occurrence threshold and the short circuit non-occurrence threshold corresponding to the difference in temperature with the ratio of the second self-discharge amount to the first self-discharge amount.

According to an exemplary embodiment of the present disclosure, the processor 150 may perform control to output, through the output device 130, a message informing that the preliminary diagnosis of the battery is required when a case where the ratio of the second self-discharge amount to the first self-discharge amount is greater than the short circuit non-occurrence threshold and is less than the short circuit occurrence threshold has occurred continuously and repeatedly a predetermined number of times. That is, the processor 150 may provide a guidance indicating that preliminary diagnosis is required only when a case where the ratio of the second self-discharge amount to the first self-discharge amount is greater than the short circuit non-occurrence threshold and is less than the short circuit occurrence threshold has occurred continuously and repeatedly a predetermined number of times, preventing misdiagnosis or overdiagnosis.

According to an exemplary embodiment of the present disclosure, when the ratio of the second self-discharge amount to the first self-discharge amount is greater than the short circuit occurrence threshold, the processor 150 may perform control to output, through the output device 130, a message indicating that an emergency diagnosis of the battery is required. In the instant case, the processor 150 may output an image in a flashing state and simultaneously output a warning sound to allow the user to intuitively recognize that an urgent diagnosis for the battery is required.

Figure 8:
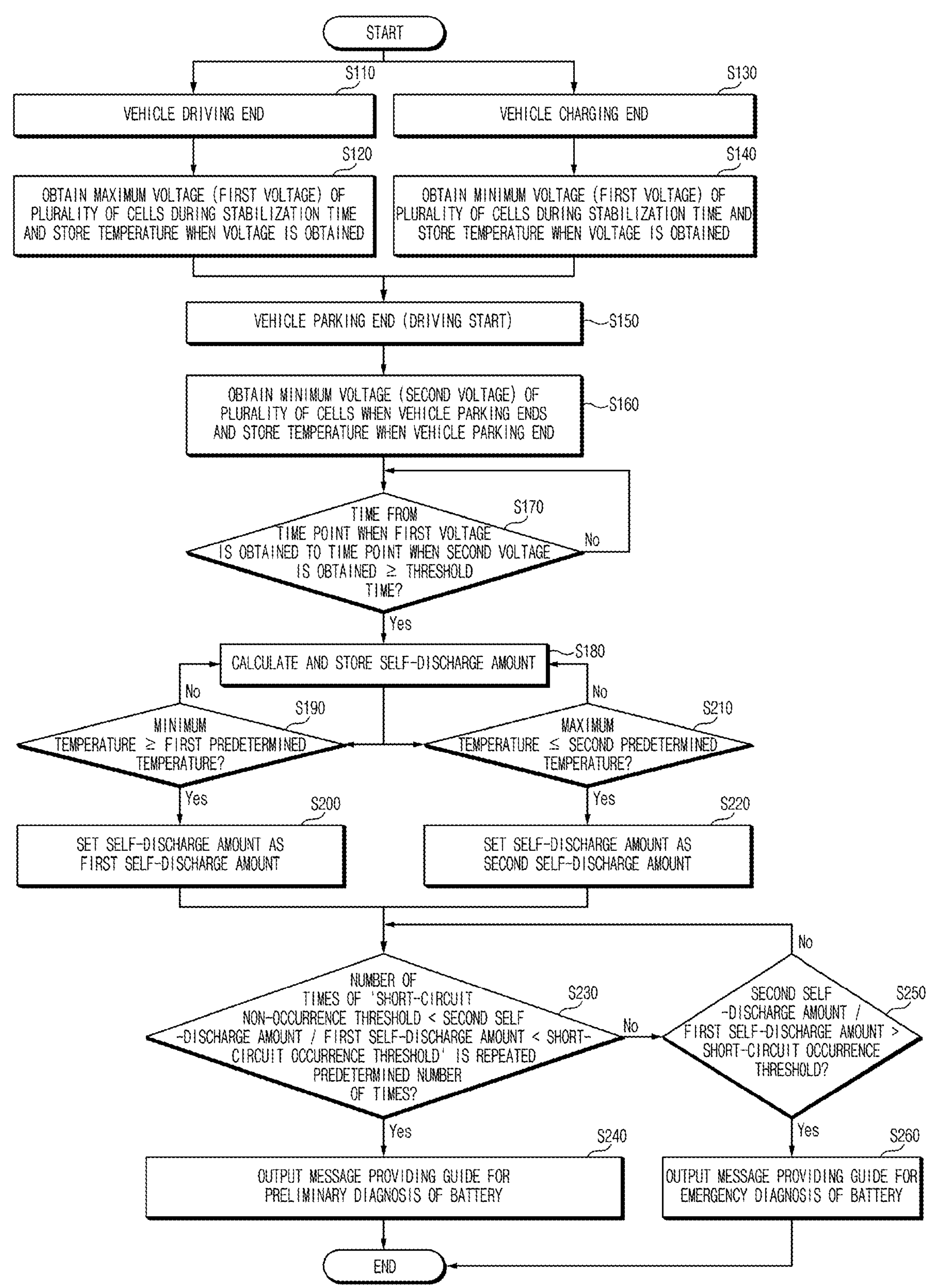
FIG. 8 is a diagram illustrating a method for monitoring a battery of a vehicle according to an exemplary embodiment of the present disclosure.

FIG. 8 is a diagram illustrating a method for monitoring a battery of a vehicle according to an exemplary embodiment of the present disclosure.

Referring to FIG. 8, when the processor 150 determines that the driving of the vehicle is finished (S110), the processor 150 may obtain a voltage of each of battery cells, and obtain, as a first voltage, the maximum voltage among the voltages of the battery cells obtained during the stabilization time (e.g., 2 hours) of the battery after the driving of the vehicle is finished (S120). In S120, the processor 150 may obtain the temperature of the battery cell when obtaining the first voltage and store the temperature in a memory.

Meanwhile, when the processor 150 determines that the charging of the vehicle is finished (S130), the processor 150 may obtain a voltage of each of battery cells, and obtain, as a second voltage, the minimum voltage among the voltages of the battery cells obtained during the stabilization time (e.g., 2 hours) of the battery after the charging of the vehicle is finished (S140). In S140, the processor 150 may obtain the temperature of the battery cell when obtaining the first voltage and store the temperature in a memory.

The processor 150 may be configured to determine a time point at which parking of the vehicle ends (a time point at which driving starts) from the time point at which the stabilization time ends (S150). The processor 150 may be configured to determine a self-discharge time from the time point at which the stabilization time ends to the time point at which parking of the vehicle ends, and obtain, as a second voltage, the minimum voltage V2 among the voltages obtained in the battery cells during the self-discharge time (S160). In S160, the processor 150 may obtain the temperature of the battery cell when obtaining the second voltage and store the temperature in a memory. According to an exemplary embodiment of the present disclosure, the processor 150 may start obtaining the temperature of the battery cell when the first voltage is obtained and continuously obtain the temperature of the battery cell until the second voltage is obtained.

In S160, according to an exemplary embodiment of the present disclosure, the processor 150 may be configured to generate a moving average line representing the average of the cell voltages of each battery, determine the slope of the linear function of the moving average line, predict a voltage at the time point when parking of the vehicle is finished using the slope of the linear function, and set the predicted voltage as the second voltage.

The processor 150 may be configured to determine whether a time required from the time point at which the first voltage is obtained to the time point at which the second voltage is obtained exceeds a threshold time (e.g., 6 hours) (S170).

The processor 150 may be configured to determine the amount of self-discharge when it is determined that the time from the time point at which the first voltage is obtained to the time point at which the second voltage is obtained exceeds the threshold time (e.g., 6 hours) (S180). In S180, according to an exemplary embodiment of the present disclosure, the amount of self-discharge may be determined as a difference between a first discharge amount and a second discharge amount. In S180, the processor 150 may store the determined amount of self-discharge in the memory. S180 may include an operation of determining the first discharge amount and the second discharge amount. Hereinafter, a method of determining the first discharge amount and the second discharge amount will be described in detail.

According to an exemplary embodiment of the present disclosure, the processor 150 may be configured to determine the first discharge amount based on the first voltage and the second voltage. When the time required from the time point at which the first voltage is obtained to the time point at which the second voltage is obtained does not exceed the threshold time, an error in the voltage sensor may cause an error in the SOC value of the battery, reducing the accuracy of battery information. Therefore, the processor 150 may be configured to determine the first discharge amount based on the first voltage and the second voltage only when the time required from the time point at which the first voltage is obtained to the time point at which the second voltage is obtained exceeds the threshold time, thus making it possible to accurately determine the amount of self-discharge.

According to an exemplary embodiment of the present disclosure, the processor 150 may be configured to determine the amount of change in the state of charge of the battery with respect to the difference between the first voltage and the second voltage, and determine the first discharge amount based on a pre-stored lookup table. According to an exemplary embodiment of the present disclosure, the processor 150 may be configured to generate a lookup table representing battery capacity according to SOC based on an open circuit voltage (OCV)-state of charge (SOC) profile and store the lookup table in the memory 140 in advance. According to an exemplary embodiment of the present disclosure, the processor 150 may store the battery capacity by performing classification into a case where the state of health (SOH) is 100% and a case where the state of health (SOH) is 90%, and the battery capacity may be determined by Equation 1.

According to an exemplary embodiment of the present disclosure, the processor 150 may be configured to determine the amount of change in the state of charge of the battery with respect to the difference between the first voltage and the second voltage based on the pre-stored lookup table and determine the first discharge amount. According to an exemplary embodiment of the present disclosure, the processor 150 may match, with the OCV, the first voltage and the second voltage when the time required from the time point at which the first voltage is obtained to the time point at which the second voltage is obtained exceeds the threshold time. Furthermore, the processor 150 may be configured to determine the amount of change in SOC relative to the amount of change in OCV according to a difference between the first voltage and the second voltage, and determine a corresponding difference in battery capacity as the first discharge amount.

The processor 150 may be configured to determine a capacity consumed for cell balancing and voltage measurement of the battery, and may set the capacity consumed for battery cell balancing and voltage measurement as the second discharge amount.

The processor 150 may be configured to determine whether the minimum temperature among the temperatures of the battery cells from the time point at which the first voltage is obtained to the time point at which the second voltage is obtained is higher than or equal to a first predetermined temperature (S190).

The processor 150 may set the amount of self-discharge to a first self-discharge amount when the minimum temperature among the temperatures of the battery cells from the time point at which the first voltage is obtained to the time point at which the second voltage is obtained is higher than or equal to the first predetermined temperature (S200). Here, the first predetermined temperature may be set to 20 degrees (° C.), and the first self-discharge amount may mean a room temperature discharge amount.

The processor 150 may be configured to determine whether the maximum temperature among the temperatures of the battery cells from the time point at which the first voltage is obtained to the time point at which the second voltage is obtained is equal to or less than a second predetermined temperature (S210).

The processor 150 may set the amount of self-discharge to a second self-discharge amount when the maximum temperature among the temperatures of the battery cells from the time point at which the first voltage is obtained to the time point at which the second voltage is obtained is equal to or less than the second predetermined temperature lower than the first predetermined temperature (S220). Here, the second predetermined temperature may be set to 5 degrees (° C.), and the second self-discharge amount may mean a low-temperature discharge amount.

The processor 150 may be configured to determine whether a short circuit of the battery has occurred based on the first self-discharge amount and the second self-discharge amount.

The processor 150 may be configured to determine a ratio of the second self-discharge amount to the first self-discharge amount, and determine whether a short circuit has occurred by comparing the determined ratio with a short circuit occurrence threshold and a short circuit non-occurrence threshold. According to an exemplary embodiment of the present disclosure, the processor 150 may be configured to determine the ratio of the second self-discharge amount to the first self-discharge amount in a classification manner according to an average temperature at which a voltage is obtained.

According to an exemplary embodiment of the present disclosure, the processor 150 may be configured to determine a first average temperature, which is an average of the temperatures at which the first voltage and the second voltage are obtained, when the minimum temperature at which the first voltage and the second voltage are obtained is equal to or greater than the first predetermined temperature, and determine a second average temperature, which is an average of the temperatures at which the first voltage and the second voltage are obtained, when the maximum temperature at which the first voltage and the second voltage are obtained is equal to or lower than the second predetermined temperature. Accordingly, the processor 150 may be configured to determine the ratio of the second self-discharge amount to the first self-discharge amount according to a difference between the first average temperature and the second average temperature.

The processor 150 may be configured to determine whether a case where the ratio of the second self-discharge amount to the first self-discharge amount exceeds the short circuit non-occurrence threshold and is less than the short circuit occurrence threshold has occurred continuously and repeatedly a predetermined number of times (S230).

The processor 150 may perform control to output, through the output device 130, a message informing that the preliminary diagnosis of the battery is required when a case where the ratio of the second self-discharge amount to the first self-discharge amount is greater than the short circuit non-occurrence threshold and is less than the short circuit occurrence threshold has occurred continuously and repeatedly a predetermined number of times (S240). That is, the processor 150 may prevent misdiagnosis or overdiagnosis by informing that a preliminary diagnosis is required only when a case where the ratio of the second self-discharge amount to the first self-discharge amount is greater than the short circuit non-occurrence threshold and is less than the short circuit occurrence threshold has occurred continuously and repeatedly a predetermined number of times.

The processor 150 may be configured to determine whether a ratio of the second self-discharge amount to the first self-discharge amount exceeds the short circuit occurrence threshold (S250).

When the ratio of the second self-discharge amount to the first self-discharge amount exceeds the short circuit occurrence threshold, the processor 150 may perform control to output, through the output device 130, a message indicating that an emergency diagnosis of the battery is required (S260). In the instant case, the processor 150 may output an image in a flashing state and simultaneously output a warning sound to allow the user to intuitively recognize that an urgent diagnosis for the battery is required.

The processor 150 may preset a short circuit occurrence threshold and a short circuit non-occurrence threshold to determine whether a short circuit has occurred in the battery based on the first self-discharge amount and the second self-discharge amount.

The processor 150 may be configured to determine a first test self-discharge amount and a second test self-discharge amount to set the short circuit occurrence threshold and the short circuit non-occurrence threshold.

First, the processor 150 may obtain a first test voltage and a second test voltage to determine the first test self-discharge amount and the second test self-discharge amount. Here, the processor 150 may obtain the first test voltage in the same manner as obtaining the first voltage, and obtain the second test voltage in the same manner as obtaining the second voltage.

The processor 150 may be configured to determine a first test temperature, which is an average of the temperatures at which the first test voltage and the second test voltage are obtained, when the minimum temperature at which the first test voltage and the second test voltage are obtained is equal to or greater than the first predetermined temperature, and determine a second test temperature, which is an average of the temperatures at which the first test voltage and the second test voltage are obtained, when the maximum temperature at which the first test voltage and the second test voltage are obtained is equal to or lower than the second predetermined temperature.

The processor 150 may set the short circuit occurrence threshold and the short circuit non-occurrence threshold while the ratios of the second test self-discharge amount to the first test self-discharge amount are classified into a case where a short circuit occurs and a case where a short circuit does not occur in the battery, and the short circuit occurrence threshold and the short circuit non-occurrence threshold may be stored separately by differences between the first test temperature and the second test temperature. For more detailed description, refer to Table 2.

According to an exemplary embodiment of the present disclosure, the processor 150 may match a difference between the first average temperature and the second average temperature with a difference between the first test temperature and the second test temperature, and compare the short circuit occurrence threshold and the short circuit non-occurrence threshold corresponding to the difference in temperature with the ratio of the second self-discharge amount to the first self-discharge amount.

According to another exemplary embodiment of the present disclosure, when the second self-discharge amount is greater than the first self-discharge amount after S220, the processor 150 may be configured to determine whether a short circuit has occurred in the battery and a short circuit strength based on a short circuit resistance value. According to an exemplary embodiment of the present disclosure, when the second self-discharge amount is greater than or equal to the first self-discharge amount, the processor 150 may be configured to determine that a soft short circuit has occurred because the short circuit resistance has a second resistance value (e.g., 1 kΩ) smaller than the first resistance value.

Furthermore, because the short-circuit resistance has a third resistance value (100 ohms) smaller than the second resistance value and then a fourth resistance value (10 ohms) as the excess of the second self-discharge amount over the first self-discharge amount increases, the processor 150 may be configured to determine that a hard short-circuit has occurred.

Figure 9:
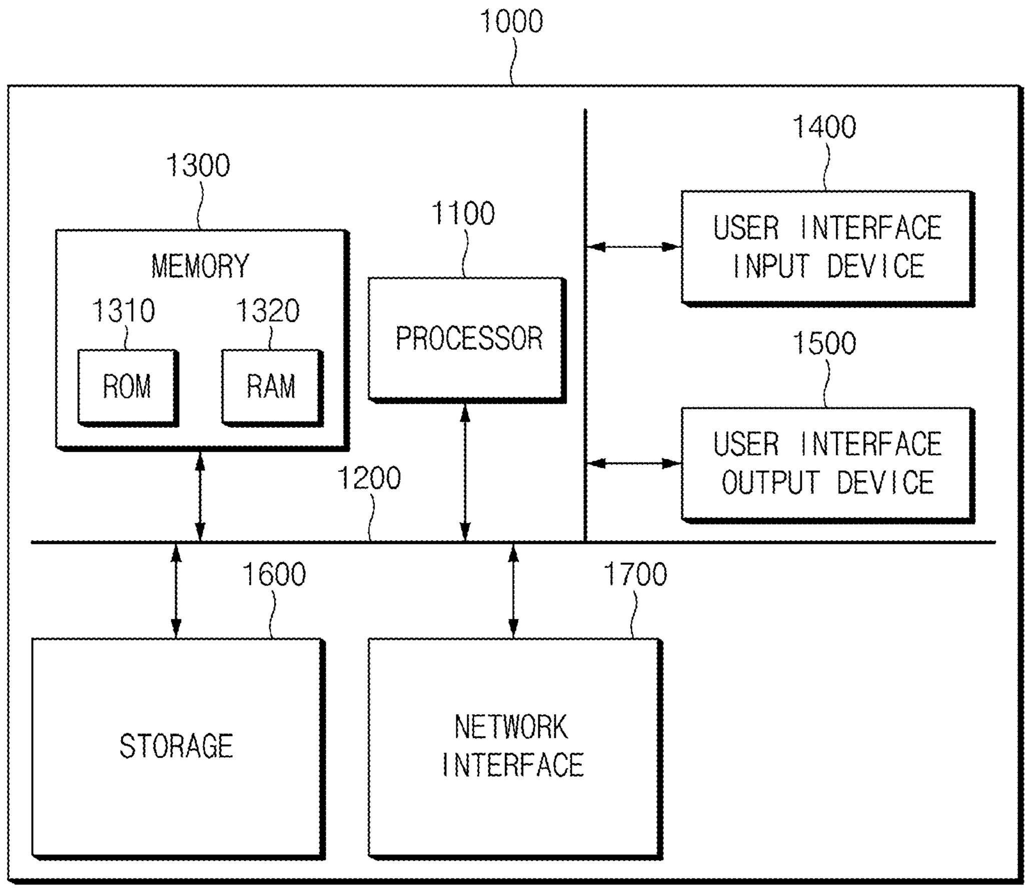
FIG. 9 illustrates a configuration of a computing system for executing a method according to an exemplary embodiment of the present disclosure.

FIG. 9 illustrates a configuration of a computing system for executing a method according to an exemplary embodiment of the present disclosure.

Referring to FIG. 9, a computing system 1000 may include at least one processor 1100, a memory 1300, a user interface input device 1400, a user interface output device 1500, storage 1600, and a network interface 1700, which are connected to each other via a bus 1200.

The processor 1100 may be a central processing unit (CPU) or a semiconductor device that processes instructions stored in the memory 1300 and/or the storage 1600. The memory 1300 and the storage 1600 may include various types of volatile or non-volatile storage media. For example, the memory 1300 may include a Read-Only Memory (ROM) 1310 and a Random Access Memory (RAM) 1320.

Thus, the operations of the method or the algorithm described in connection with the exemplary embodiments included herein may be embodied directly in hardware or a software module executed by the processor 1100, or in a combination thereof. The software module may reside on a storage medium (that is, the memory 1300 and/or the storage 1600) such as a RAM, a flash memory, a ROM, an EPROM, an EEPROM, a register, a hard disk, a removable disk, and a CD-ROM. The exemplary storage medium may be coupled to the processor 1100, and the processor 1100 may read information out of the storage medium and may record information in the storage medium. Alternatively, the storage medium may be integrated with the processor 1100. The processor and the storage medium may reside in an application specific integrated circuit (ASIC). The ASIC may reside within a user terminal. In another case, the processor and the storage medium may reside in the user terminal as separate components.

The above description is merely illustrative of the technical idea of the present disclosure, and various modifications and variations may be made without departing from the essential characteristics of the present disclosure by those skilled in the art to which the present disclosure pertains.

Accordingly, the exemplary embodiment included in an exemplary embodiment of the present disclosure is not intended to limit the technical idea of the present disclosure but to describe the present disclosure, and the scope of the technical idea of the present disclosure is not limited by the embodiment. The scope of protection of the present disclosure should be interpreted by the following claims, and all technical ideas within the scope equivalent thereto should be construed as being included in the scope of the present disclosure.

The apparatus and method for monitoring a battery according to an exemplary embodiment of the present disclosure may prevent a fire from occurring by monitoring the occurrence of a short circuit, which is a major cause of a battery fire, to secure the safety of using a battery-applied device.

The apparatus and method for monitoring a battery according to an exemplary embodiment of the present disclosure may monitor the amount of self-discharge of a battery according to temperature, determine whether a short circuit has occurred based on the amount of self-discharge, and inform a user of the occurrence of the short circuit when the short circuit has occurred.

The apparatus and method for monitoring a battery according to an exemplary embodiment of the present disclosure may ensure that sufficient time is secured between a time point at which the minimum voltage of the battery cell is measured during the stabilization time after the driving of the vehicle is finished or the charging of the vehicle is finished, and a time point at which the minimum voltage of the battery cell is measured before driving of the vehicle is resumed, thus minimizing sensing error and accurately determining the amount of self-discharge.

The apparatus and method for monitoring a battery according to an exemplary embodiment of the present disclosure may determine whether a short circuit has occurred in a battery in various environments by monitoring the self-discharge of the battery to determine whether a short circuit has occurred in the battery and perform the monitoring in self-discharge at room temperature and self-discharge at low temperature.

In various exemplary embodiments of the present disclosure, the memory and the processor may be provided as one chip, or provided as separate chips.

In various exemplary embodiments of the present disclosure, the scope of the present disclosure includes software or machine-executable commands (e.g., an operating system, an application, firmware, a program, etc.) for enabling operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In the present specification, unless stated otherwise, a singular expression includes a plural expression unless the context clearly indicates otherwise.

In exemplary embodiments of the present disclosure, "at least one of A and B" may refer to "at least one of A or B" or "at least one of combinations of at least one of A and B". Furthermore, "one or more of A and B" may refer to "one or more of A or B" or "one or more of combinations of one or more of A and B".

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. An apparatus for monitoring a battery of a vehicle, which includes one or more sensors and a processor, the apparatus comprising:

wherein the one or more sensors are configured to:

obtain a first voltage during a stabilization time of the battery;

obtain a minimum voltage measured from a time point when the stabilization time ends to a time point when parking of the vehicle ends as a second voltage of the battery; and detect a temperature of the battery from a time point when the first voltage is obtained to a time point when the second voltage is obtained, wherein the processor operatively connected to the one or more sensors is configured to:

determine a first discharge amount based on the first voltage and the second voltage;

determine a second discharge amount consumed in balancing the battery and operating the one or more sensors;

determine a first self-discharge amount and a second self-discharge amount based on the first discharge amount, the second discharge amount, and the temperature; and determine whether a short circuit has occurred in the battery based on the first self-discharge amount and the second self-discharge amount, wherein the processor is configured to determine a short circuit strength based on a short circuit resistance value, when the second self-discharge amount is greater than the first self-discharge amount.

2. The apparatus of claim 1, wherein the one or more sensors is further configured to obtain, as the first voltage, a maximum voltage among voltages obtained during the stabilization time of the battery after driving of the vehicle is finished.

3. The apparatus of claim 1, wherein the one or more sensors is further configured to obtain, as the first voltage, a minimum voltage among voltages obtained during the stabilization time of the battery after charging of the vehicle is finished.

4. The apparatus of claim 1, wherein the processor is further configured to determine the first discharge amount based on the first voltage and the second voltage in response that a time required from the time point when the first voltage is obtained to the time point when the second voltage is obtained exceeds a threshold time.

5. The apparatus of claim 1, wherein the processor is further configured to determine an amount of change in a state of charge (SOC) value of the battery with respect to a difference between the first voltage and the second voltage based on a pre-stored lookup table and determine the first discharge amount.

6. The apparatus of claim 1, wherein the processor is further configured to determine a difference between the first discharge amount and the second discharge amount as a self-discharge amount.

7. The apparatus of claim 6, wherein the processor is further configured to set, as the first self-discharge amount, the self-discharge amount in response that a minimum temperature of temperatures of the battery from the time point when the first voltage is obtained to the time point when the second voltage is obtained is equal to or greater than a first predetermined temperature.

8. The apparatus of claim 7, wherein the processor is further configured to set, as the second self-discharge amount, the self-discharge amount in response that a maximum temperature of the temperatures of the battery from the time point when the first voltage is obtained to the time point when the second voltage is obtained is equal to or lower than a second predetermined temperature lower than the first predetermined temperature.

9. The apparatus of claim 8, wherein the processor is further configured to output a message informing that a preliminary diagnosis of the battery is required in response that a case where a ratio of the second self-discharge amount to the first self-discharge amount is greater than a short circuit non-occurrence threshold and is less than a short circuit occurrence threshold has occurred continuously and repeatedly a predetermined number of times.

10. The apparatus of claim 9, wherein the processor is further configured to output a message informing that an emergency diagnosis of the battery is required in response that the ratio of the second self-discharge amount to the first self-discharge amount is greater than the short-circuit occurrence threshold.

11. A method of monitoring a battery of a vehicle, the method comprising:

obtaining, by at least one or more sensors, a first voltage during a stabilization time of the battery;

obtaining, by the at least one or more sensors, a minimum voltage measured from a time point when the stabilization time ends to a time point when parking of the vehicle ends as a second voltage of the battery; and detecting, by the at least one or more sensors, a temperature of the battery from a time point when the first voltage is obtained to a time point when the second voltage is obtained;

determining, by a processor operatively connected to the one or more sensors, a first discharge amount based on the first voltage and the second voltage;

determining, by the processor, a second discharge amount consumed in balancing the battery and operating the one or more sensors;

determining, by the processor, a first self-discharge amount and a second self-discharge amount based on the first discharge amount, the second discharge amount, and the temperature;

determining, by the processor, whether a short circuit has occurred in the battery based on the first self-discharge amount and the second self-discharge amount; and determining, by the processor, a short circuit strength based on a short circuit resistance value, when the second self-discharge amount is greater than the first self-discharge amount.

12. The method of claim 11, further including:

obtaining, by the at least one or more sensors, as the first voltage, a maximum voltage among voltages obtained during the stabilization time of the battery after driving of the vehicle is finished.

13. The method of claim 11, further including:

obtaining, by the at least one or more sensors, as the first voltage, a minimum voltage among voltages obtained during the stabilization time of the battery after charging of the vehicle is finished.

14. The method of claim 11, further including:

determining the first discharge amount based on the first voltage and the second voltage in response that a time required from the time point when the first voltage is obtained to the time point when the second voltage is obtained exceeds a threshold time.

15. The method of claim 11, further including:

determining, by the processor, an amount of change in a state of charge (SOC) value of the battery with respect to a difference between the first voltage and the second voltage based on a pre-stored lookup table and determining the first discharge amount.

16. The method of claim 11, further including:

determining, by the processor, a difference between the first discharge amount and the second discharge amount as a self-discharge amount.

17. The method of claim 16, further including:

setting, by the processor, as the first self-discharge amount, the self-discharge amount in response that a minimum temperature of temperatures of the battery from the time point when the first voltage is obtained to the time point when the second voltage is obtained is equal to or greater than a first predetermined temperature.

18. The method of claim 17, further including:

setting, by the processor, as the second self-discharge amount, the self-discharge amount in response that a maximum temperature of the temperatures of the battery from the time point when the first voltage is obtained to the time point when the second voltage is obtained is equal to or lower than a second predetermined temperature lower than the first predetermined temperature.

19. The method of claim 18, further including:

outputting, by the processor, a message informing that a preliminary diagnosis of the battery is required in response that a case where a ratio of the second self-discharge amount to the first self-discharge amount is greater than a short circuit non-occurrence threshold and is less than a short circuit occurrence threshold has occurred continuously and repeatedly a predetermined number of times.

20. The method of claim 19, further including:

outputting, by the processor, a message informing that an emergency diagnosis of the battery is required in response that the ratio of the second self-discharge amount to the first self-discharge amount is greater than the short-circuit occurrence threshold.

* * * * *